United States Patent
Cengarle et al.

(10) Patent No.: US 12,375,053 B2
(45) Date of Patent: Jul. 29, 2025

(54) AUTOMATIC GENERATION AND SELECTION OF TARGET PROFILES FOR DYNAMIC EQUALIZATION OF AUDIO CONTENT

(71) Applicants: Dolby Laboratories Licensing Corporation, San Francisco, CA (US); DOLBY INTERNATIONAL AB, Dublin (IE)

(72) Inventors: Giulio Cengarle, Barcelona (ES); Nicholas Laurence Engel, San Francisco, CA (US); Patrick Winfrey Scannell, San Francisco, CA (US); Davide Scaini, Barcelona (ES)

(73) Assignees: Dolby Laboratories Licensing Corporation, San Francisco, CA (US); DOLBY INTERNATIONAL AB, Dublin (IE)

(*) Notice: Subject to any disclaimer, the term of this patent is extended or adjusted under 35 U.S.C. 154(b) by 244 days.

(21) Appl. No.: 18/253,850

(22) PCT Filed: Nov. 18, 2021

(86) PCT No.: PCT/US2021/059827
§ 371 (c)(1),
(2) Date: May 22, 2023

(87) PCT Pub. No.: WO2022/115303
PCT Pub. Date: Jun. 2, 2022

(65) Prior Publication Data
US 2024/0022224 A1  Jan. 18, 2024

Related U.S. Application Data

(60) Provisional application No. 63/145,017, filed on Feb. 3, 2021.

(30) Foreign Application Priority Data
Nov. 27, 2020 (ES) ................. P202031189

(51) Int. Cl.
*H03G 5/00* (2006.01)
*G10L 15/18* (2013.01)
(Continued)

(52) U.S. Cl.
CPC ......... *H03G 5/005* (2013.01); *G10L 15/1815* (2013.01); *G10L 25/18* (2013.01);
(Continued)

(58) Field of Classification Search
CPC ..... H03G 5/005; G10L 15/1815; G10L 25/18; G10L 25/21; H04R 3/04; H04R 2430/03
See application file for complete search history.

(56) References Cited
U.S. PATENT DOCUMENTS

| | | | |
|---|---|---|---|
| 8,140,542 B2 * | 3/2012 | Van De Par | G06F 16/683 707/603 |
| 8,929,567 B2 | 1/2015 | Crockett | |

(Continued)

FOREIGN PATENT DOCUMENTS

| | | | | |
|---|---|---|---|---|
| CN | 110728972 A | * | 1/2020 | ............. G10L 15/08 |
| WO | 2020014517 A1 | | 1/2020 | |
| WO | 2020123424 A1 | | 6/2020 | |

*Primary Examiner* — David L Ton (57) ABSTRACT

In an embodiment, a method comprises: filtering reference audio content items to separate the reference audio content items into different frequency bands; for each frequency band, extracting a first feature vector from at least a portion of each of the reference audio content items, wherein the first feature vector includes at least one audio characteristic of the reference audio content items; obtaining at least one semantic label from at least a portion of each of the reference audio content items; obtaining a second feature vector consisting of the first feature vectors per frequency band and (Continued)

the at least one semantic label; generating, based on the second feature vector, cluster feature vectors representing centroids of clusters; separating the reference audio content items according to the cluster feature vectors; and computing an average target profile for each cluster based on the reference audio content items in the cluster.

20 Claims, 5 Drawing Sheets

(51) Int. Cl.
*G10L 25/18* (2013.01)
*G10L 25/21* (2013.01)
*H04R 3/04* (2006.01)

(52) U.S. Cl.
CPC ............... *G10L 25/21* (2013.01); *H04R 3/04* (2013.01); *H04R 2430/03* (2013.01)

(56) References Cited

U.S. PATENT DOCUMENTS

| | | |
|---|---|---|
| 10,044,337 B2 | 8/2018 | Lu |
| 10,165,362 B2 | 12/2018 | Maziewski |
| 10,580,424 B2 | 3/2020 | Mirzahasanloo |
| 10,707,824 B2 | 7/2020 | Wang |
| 10,776,420 B2 | 9/2020 | Donier |
| 10,778,171 B2 | 9/2020 | Fleischmann |
| 10,803,879 B2 | 10/2020 | Lu |
| 2008/0075303 A1 | 3/2008 | Kim |
| 2015/0254054 A1 | 9/2015 | Sun |
| 2016/0078882 A1* | 3/2016 | Lu .................... H04R 29/00 381/56 |
| 2019/0028766 A1 | 1/2019 | Wold |
| 2019/0286409 A1 | 9/2019 | Klimanis |
| 2019/0387998 A1 | 12/2019 | Garten |
| 2021/0312937 A1 | 10/2021 | Cengarle |
| 2021/0312941 A1* | 10/2021 | Vicente .................. G06N 3/08 |

\* cited by examiner

AUTOMATIC GENERATION AND SELECTION OF TARGET PROFILES FOR DYNAMIC EQUALIZATION OF AUDIO CONTENT

CROSS REFERENCE TO RELATED APPLICATIONS

This application is a U.S. National Stage application under 35 U.S.C. § 371 of International Application No. PCT/US2021/059827, filed 18 Nov. 2021, which claims priority to Spanish Patent Application No. P202031189, filed 27 Nov. 2020 and U.S. provisional application 63/145,017 filed 3 Feb. 2021, all of which are incorporated herein by reference in their entirety.

TECHNICAL FIELD

This disclosure relates generally to audio signal processing, and more particularly to dynamic equalization of audio content.

BACKGROUND

Dynamic equalization (DEQ) is a technology that modifies the spectral contour and dynamic range of audio content (e.g., music or speech files) by applying time-dependent and frequency-dependent gains to the audio content, so that the audio content matches the spectral contour and dynamic range of a particular reference audio content. In DEQ, the spectral contour and dynamic range of audio content are represented by a set of quantiles per frequency band that represent a statistical distribution of energy in the audio content. This set of quantiles are commonly referred to as the "profile" of the audio content. After the quantiles are obtained for the reference audio content (hereinafter, "target profile") and an input audio content (herein, "input profile"), DEQ computes gains to apply to the input audio content, so that the quantiles of the input audio content are modified to match the reference audio content.

Existing DEQ techniques obtain target profiles by manually selecting a set of reference audio content from which the target profiles are generated. Once the target profiles are generated, the selection of a desired target profile to use for a given input audio content is left to the user. The choice of a particular target profile among a plurality of target profiles has a significant impact on the subjective quality of the audio content after DEQ is applied. Selecting an inappropriate target profile may result in perceptual degradation of the input audio content. Some relevant examples of perception degradation include processing a classical music recording (e.g., wide dynamic range, mellow treble balance) to match an electronic dance music (EDM) recording (e.g., small dynamic range, prominent treble), or processing a male speech recording to match the equalization (EQ) contour of a female speech recording.

When a plurality of reference audio content items are available, it is desirable to automatically generate a plurality of significant maximally different target profiles. Also, in a situation where user input is not expected and a plurality of target profiles are available, it is desirable to select automatically the appropriate target profile.

SUMMARY

Embodiments are disclosed for automatic generation and selection of target profiles for DEQ of audio content.

In an embodiment, a method of automatically generating target profiles for dynamic equalization of audio content comprises: obtaining reference audio content items; filtering the reference audio content items to separate the reference audio content items into different frequency bands of a frequency spectrum of the reference audio content items; for each frequency band, extracting a first feature vector from at least a portion of each of the reference audio content items, wherein the first feature vector includes at least one audio characteristic of the reference audio content items; obtaining at least one semantic label describing the reference audio content items from at least a portion of each of the reference audio content items; obtaining a second feature vector consisting of the first feature vectors per frequency band and the at least one semantic label; generating, based on the second feature vector, cluster feature vectors representing centroids of clusters, where each reference audio content item is assigned to at least one cluster; separating the reference audio content items according to the cluster feature vectors; computing an average target profile for each cluster based on the reference audio content items in the cluster; and storing the average target profile and corresponding cluster feature vector for each cluster in a storage device.

In an embodiment, generating cluster feature vectors representing centroids of clusters includes generating cluster feature vectors using only the at least one audio characteristics of the first feature vector.

In an embodiment, generating cluster feature vectors representing centroids of clusters includes generating cluster feature vectors using only the at least one semantic label of the second feature vector.

In an embodiment, a method of automatically generating target profiles for dynamic equalization of audio content comprises: obtaining, with at least one processor, a first set of reference audio content items; filtering, with the at least one processor, the first set of reference audio content items to separate the first set of reference audio content items into different frequency bands of a frequency spectrum of the reference audio content items; extracting, with the at least one processor, a semantic label feature vector from the first set of reference audio content items, wherein the semantic label feature vector includes a semantic label describing the first set of reference audio content items; generating, with the at least one processor and based on the semantic label feature vector, a first set of cluster feature vectors representing a first set of centroids of a first set of clusters; separating, with the at least one processor, the first set of reference audio content items into a first set of clusters according to the first set of cluster feature vectors; for each cluster in the first set of clusters and for each frequency band: extracting, with the at least one processor, an audio characteristic feature vector from the reference audio content items assigned to the cluster, wherein the audio characteristic feature vector includes an audio characteristic of the first set of reference audio content items; generating, with the at least one processor and based on the audio characteristic feature vector, a second set of cluster feature vectors representing a second set of centroids of a second set of clusters; separating, with the at least one processor, the reference audio content items into a second set of clusters according to the second set of cluster feature vectors; computing, with the at least one processor, an average target profile for each cluster in the second set of clusters based on the reference audio content items in the cluster; and storing, with the at least one processor, the average target profile and the corresponding second set of cluster feature vectors in a storage device.

In an embodiment, a method of automatically generating target profiles for dynamic equalization of audio content comprises: obtaining, with at least one processor, reference audio content items; filtering, with the at least one processor, the reference audio content items to separate the reference audio content items into different frequency bands of a frequency spectrum of the reference audio content items; for each frequency band, extracting, with the at least one processor, an audio characteristic feature vector from the reference audio content items, wherein the audio characteristic feature vector includes an audio characteristic of the reference audio content items; generating, with the at least one processor and based on the audio characteristic feature vector, cluster feature vectors representing centroids of clusters, where each reference audio content item is assigned to at least one cluster; separating, with the at least one processor, the reference audio content items according to the cluster feature vectors; assigning to each cluster feature vector a semantic label based on semantic labels associated with individual reference audio content items in the cluster; computing, with the at least one processor, an average target profile for each cluster based on the semantic label assigned to the cluster; and storing, with the at least one processor, the average target profile and corresponding cluster feature vector for each vector and for each frequency band in a storage device.

In an embodiment, the at least one audio characteristic is average energy.

In an embodiment, the at least one audio characteristic is dynamic range based on a difference between two percentiles in an energy distribution of the reference audio content item.

In an embodiment, the at least one audio characteristic is spectral slope comprising a line that fits an average energy between two frequency bands.

In an embodiment, the at least one audio characteristic is spectral flux

In an embodiment, the at least one audio characteristic is crest factor.

In an embodiment, the at least one audio characteristic is a zero crossing rate that is used to efficiently discriminate, e.g., music from speech, and thus improve clustering.

In an embodiment, cluster feature vectors are generated using k-means clustering.

In an embodiment, the method further comprises: obtaining, with the at least one processor, a number of unique genre labels represented in the reference audio content; and setting a minimum number of clusters equal to the number of genres represented in the reference audio content.

In an embodiment, the number of unique genre labels are obtained from at least one of an audio content classifier, metadata of the reference audio content items, or from a human listener.

In an embodiment, the semantic label is obtained from at least one of an audio content classifier, metadata of the reference audio content item, or from a human listener.

In an embodiment, the audio characteristics and/or the semantic labels are computed using only a portion of the audio content item (e.g., the first 30 seconds).

In an embodiment, a method of automatically selecting target profiles for dynamic equalization of audio content comprises: obtaining, with at least one processor, an input audio content item; filtering, with the at least one processor, the input audio content item to separate the input audio content item into different frequency bands of a frequency spectrum of the input audio content item; for each frequency band, extracting, with the at least one processor, a first feature vector from the input audio content item, wherein the first feature vector includes at least one audio characteristic of the input audio content item; obtaining at least one semantic label describing the input audio content item; obtaining a second feature vector consisting of the first feature vectors per frequency band and the at least one semantic label; computing, with the at least one processor, a distance metric between the second feature vector and a plurality of cluster feature vectors corresponding to a plurality of target profiles, wherein the plurality of cluster feature vectors each include at least one audio characteristic of reference audio content items and at least one semantic label describing the reference audio content items; selecting, with the at least one processor, a particular target profile from the plurality of target profiles corresponding to a minimum distance metric among the computed distance metrics; and applying, with the at least one processor, dynamic equalization to the input audio content item using the particular target profile.

In an embodiment, the distance metric is a Euclidian distance metric.

In an embodiment, the method further comprises: determining, with the at least one processor, that the minimum distance is larger than a threshold; rejecting the selected target profile; selecting, with the at least one processor, a default target profile; and applying, with the at least one processor, dynamic equalization on the input audio content item using the default target profile.

In an embodiment, the default target profile is an average target profile computed by averaging at least one of the plurality of target profiles or a plurality of the reference audio content items, or can be a target profile for another cluster.

In an embodiment, a system comprises: one or more processors; and a non-transitory computer-readable medium storing instructions that, upon execution by the one or more processors, cause the one or more processors to perform operations of any one of the methods described above.

In an embodiment, a non-transitory, computer-readable medium storing instructions that, upon execution by one or more processors, cause the one or more processors to perform operations of any one of the methods described above.

Other embodiments disclosed herein are directed to a system, apparatus and computer-readable medium. The details of the disclosed embodiments are set forth in the accompanying drawings and the description below. Other features, objects and advantages are apparent from the description, drawings and claims.

Particular embodiments disclosed herein provide one or more of the following advantages. The disclosed automatic generation and selection of target profiles for DEQ of audio content provides advantages over conventional manual selection of target profiles by the user by ensuring that the selection is appropriate for the audio content, and therefore does not degrade the audio content when the target profile is applied to the audio content during DEQ.

DESCRIPTION OF DRAWINGS

In the drawings, specific arrangements or orderings of schematic elements, such as those representing devices, units, instruction blocks and data elements, are shown for ease of description. However, it should be understood by those skilled in the art that the specific ordering or arrangement of the schematic elements in the drawings is not meant to imply that a particular order or sequence of processing, or separation of processes, is required. Further, the inclusion of a schematic element in a drawing is not meant to imply that such element is required in all embodiments or that the features represented by such element may not be included in or combined with other elements in some embodiments.

Further, in the drawings, where connecting elements, such as solid or dashed lines or arrows, are used to illustrate a connection, relationship, or association between or among two or more other schematic elements, the absence of any such connecting elements is not meant to imply that no connection, relationship, or association can exist. In other words, some connections, relationships, or associations between elements are not shown in the drawings so as not to obscure the disclosure. In addition, for ease of illustration, a single connecting element is used to represent multiple connections, relationships or associations between elements. For example, where a connecting element represents a communication of signals, data, or instructions, it should be understood by those skilled in the art that such element represents one or multiple signal paths, as may be needed, to affect the communication.

The same reference symbol used in various drawings indicates like elements.

DETAILED DESCRIPTION

In the following detailed description, numerous specific details are set forth to provide a thorough understanding of the various described embodiments. It will be apparent to one of ordinary skill in the art that the various described embodiments may be practiced without these specific details. In other instances, well-known methods, procedures, components, and circuits, have not been described in detail so as not to unnecessarily obscure aspects of the embodiments. Several features are described hereafter that can each be used independently of one another or with any combination of other features.

Nomenclature

As used herein, the term "includes" and its variants are to be read as open-ended terms that mean "includes, but is not limited to." The term "or" is to be read as "and/or" unless the context clearly indicates otherwise. The term "based on" is to be read as "based at least in part on." The term "one example embodiment" and "an example embodiment" are to be read as "at least one example embodiment." The term "another embodiment" is to be read as "at least one other embodiment." The terms "determined," "determines," or "determining" are to be read as obtaining, receiving, computing, calculating, estimating, predicting or deriving. In addition, in the following description and claims, unless defined otherwise, all technical and scientific terms used herein have the same meaning as commonly understood by one of ordinary skills in the art to which this disclosure belongs.

Overview

Given a set of reference content (e.g., dozens of well-recorded music or speech files), it is desirable to extract a plurality of significantly different, yet relevant, target profiles, instead of a single target profile representing the average properties of the audio content for applying DEQ to audio content. For example, a collection of well-recorded songs might include songs from different music genres (e.g., Classical, Jazz, Rock, EDM, Hip-hop) or different periods of time (e.g. the '70s versus the '80s) or performed with different instruments (e.g., vocals, guitar, piano, etc.). Creating a different target profile for each genre, instrument or period can lead to a plurality of target profiles that cover each specific use-case much better than a single target profile representing the average properties of the audio content. This is because different genres, periods or instruments usually reflect different spectral and dynamic range characteristics.

The generation of target profiles and the subsequent selection of a suitable target profile given an input audio content are two related processes. The features used for generation of target profiles are usually the same features used for the selection of a suitable target profile given an input content, where they are compared using a notion of "similarity." It is therefore important that, during the generation of target profiles, the features that lead to a robust classification of music genres, instruments or periods are included in the selection of a target profile for DEQ of audio content.

Automatic Generation of Target Profiles

Figure 1:
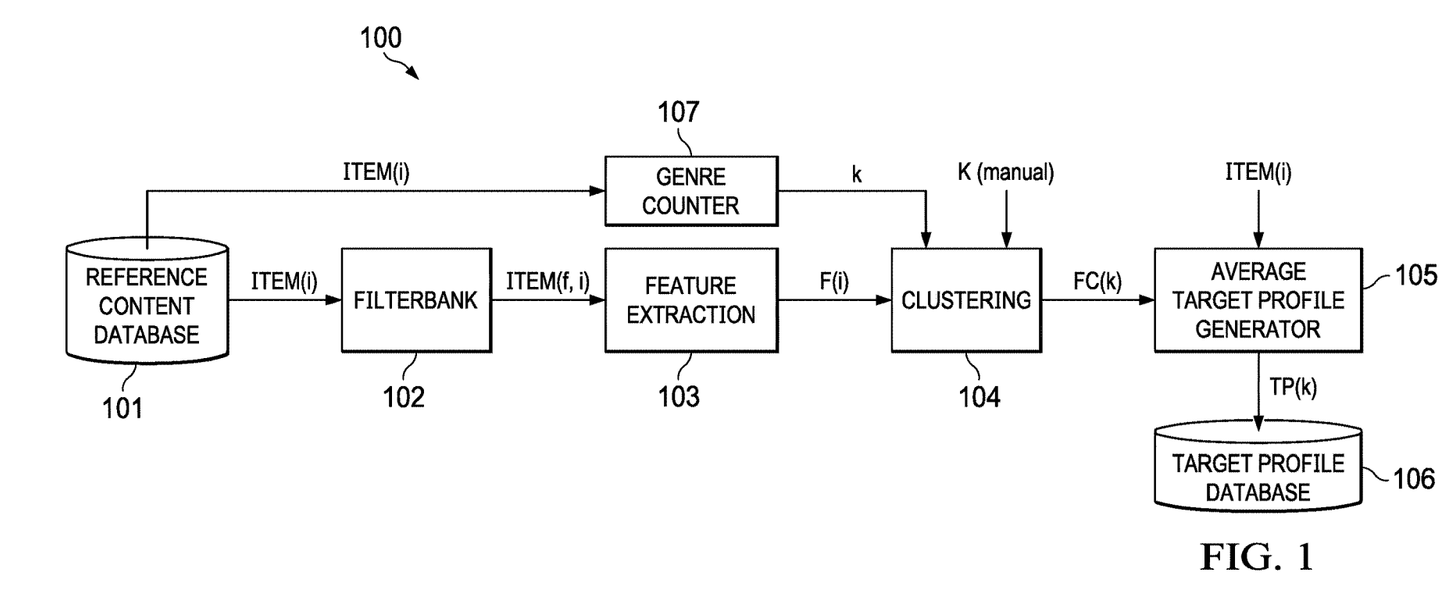
FIG. 1 is block diagram of a system for automatic generation of target profiles for DEQ of audio content, according to an embodiment.

FIG. 1 is block diagram of a system 100 for automatic generation of target profiles for DEQ of audio content, according to an embodiment. System 100 includes reference content database 101, filterbank 102, feature extraction unit 103, clustering unit 104, average target profile generator unit 105 and target profile database 106.

Each item in the reference audio content database 101 is analyzed by filterbank 102, and a set of features F(i) are extracted from the output for each item, item (f, i), by feature extraction unit 103, where "f" is the frequency band and "i" is the ith item. In an embodiment, filterbank 102 is configured to output frequency bands that are tailored to a particular application. For example, for speech enhancement applications, only frequency bands in the speech frequency range are output by filterbank 102.

Feature extraction unit 103 receives items (f, i) output by filterbank 102, extracts features from each item and concatenates the extracted features into a feature vector for the item, F(i). In an embodiment, features can include but are not limited to: the average energy (E) per band, E(f, i), the dynamic range (DR) per band, DR(f, i) and the spectral slope (SS), SS(f, i). DR (f, i) is defined as the difference between two pre-defined percentiles in the energy distribution E(f) of item i for band f (e.g., the difference between the 95 percentile and the 10 percentile), and the spectral slope SS(f, i) is defined as the slope of the line that fits E(f, i) between two pre-defined frequency bands f1 and f2 (e.g., f1=100 Hz and f2=5 kHz).

Alternatively, or in addition to the average energy per band E(f, i), other frequency-dependent, broadband or time-domain indicators can be used, such as spectral flux, peak-to-root-mean-square (peak-rms) ratio (i.e., "crest factor") and zero crossing rate (ZCR). ZCR is the rate at which an audio signal changes from positive to zero to negative or from negative to zero to positive and can be used for pitch detection, to classify percussive sounds and voice activity detection (VAD), which determines whether human speech is present in an audio signal or not. Spectral flux is a measure of how quickly the power spectrum of an audio signal is changing, calculated by comparing the power spectrum for one frame against the power spectrum from a previous frame. Peak-rms ratio (crest factor) indicates the relative balance between the peaks and the average energy of an audio signal over small periods of time.

Figure 2:
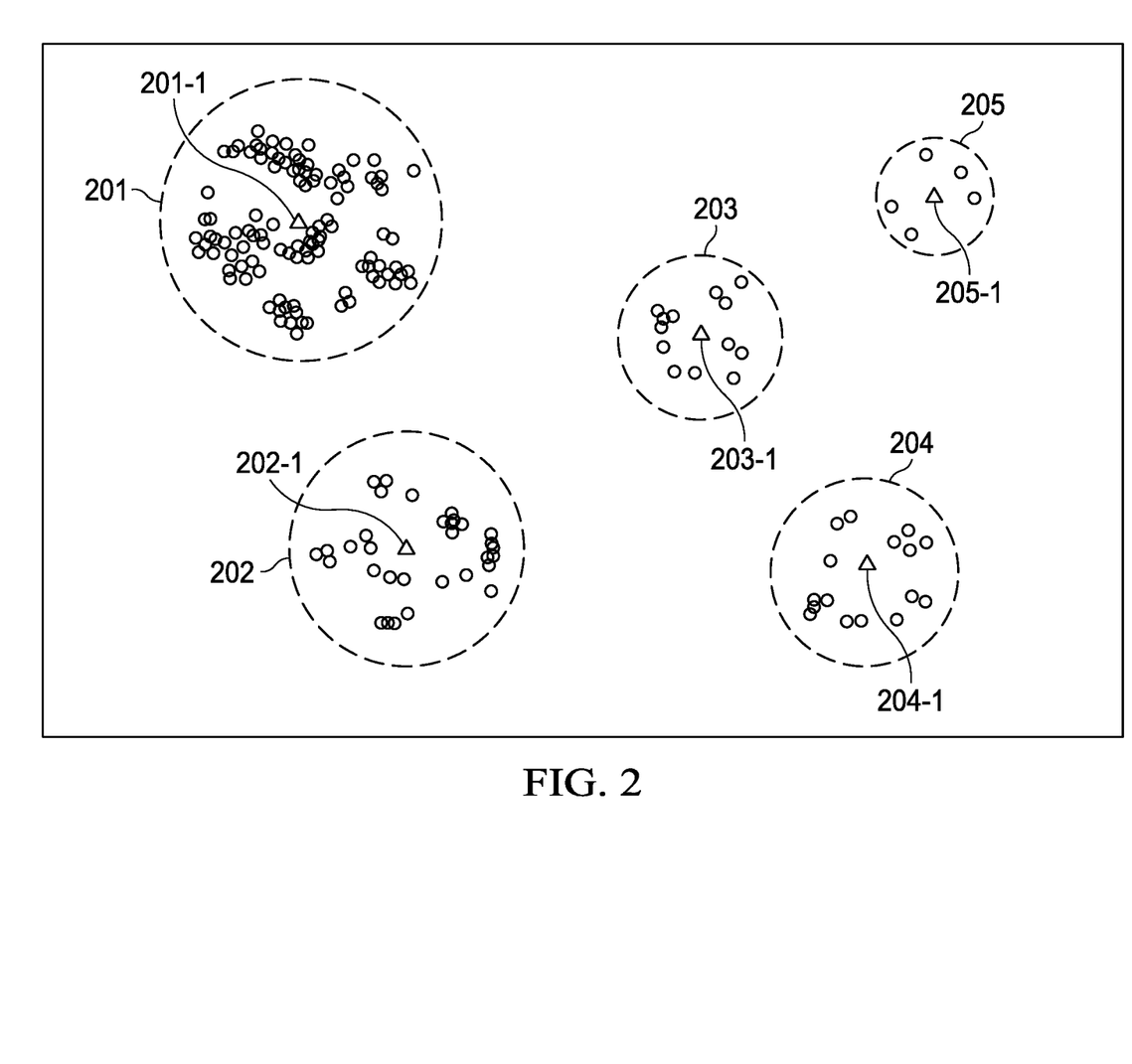
FIG. 2 illustrates clustering of feature vectors, according to an embodiment.

Clustering unit 104 applies a clustering algorithm (e.g., k-means clustering) to the feature vectors, F(i), resulting in k feature vectors, FC(k), representing the centroids of different clusters of reference audio content items, as illustrated in FIG. 2. The reference audio content items are separated according to the cluster to which they are assigned during the clustering, and the content belonging to each cluster k is used by average target profile generation unit 105 to compute an average target profile TP(k) for that cluster. The TP(k) is stored with its corresponding feature vector FC(k) in target profile database 106 to be used in an automatic target profile selection process, described in reference to FIG. 4.

In an embodiment, a target profile is a spectral profile of a reference song or track or a collection of reference songs/tracks. Target profiles can also be built for vocal or instrument tracks, e.g., by using collections of male vocalist recordings, bass recordings, etc. The terms "song" or "track" is used generically to refer to each of the excerpts of a collection. If the target profile is generated from more than one song/track, the songs/tracks are normalized before computing the profile so that they have the same loudness. In an embodiment, loudness is computed as specified by the standard European Broadcasting Union Recommendation (EBU) R128. After normalization, the statistics are built by analyzing the aggregate frames of all songs/tracks (as if all the songs/tracks had been concatenated into a single one).

Multiple target profiles, such as targets corresponding to different musical genres, instrument tracks (e.g., vocals, bass, drums, etc.), cinematic stems (e.g., dialogue, effects, music, etc.), can be generated and stored for DEQ processing. In some applications, a variety of target profiles may be provided within one and the same group to allow for user selection and variation of the resulting output effect. For example, different vocal target profiles may be provided that represent different vocal mixing styles or techniques as used by content creators.

In an embodiment, a system for generating a target profile includes a frame generator, a window function, a filterbank, a level detector and a quantile generator. A spectral profile of an input audio signal is the statistical distribution of its level per frequency band computed across audio frames. The frame generator divides an input audio signal s(t) into frames of length frameLength samples (e.g., 4096 samples) with nOverlap samples (e.g., 2048 samples) of overlap between consecutive frames, where the input audio signal at frame n is referred to as s(n). The window function (e.g., a fade-in, fade-out window) is applied to each frame n, to ensure smooth interpolation between consecutive frames. In an embodiment, a Hanning window is used. The filterbank divides the windowed signal s(t) into Nb frequency bands (e.g., 83 bands or sub-bands), wherein the signal in band f at frame n is referred to as s(n, f). The level detector computes level $L_{in}(n, f)$ of the input audio signal in each band f at each frame n. E(n, f) is the energy of the input audio signal in the band at the given frame n. The level is the energy converted to dB:

$$L_{in}(n,f)=10\cdot\log 10(E(n,f)). \quad [1]$$

In an embodiment, when computing the energy of a new frame in each band, the result can be smoothed over time by using, e.g., a first order low-pass filter described by:

$$eSmooth(n,f)=eSmooth(n-1,f)\cdot\alpha+E(n,f)\cdot(1-\alpha), \quad [2]$$

where the coefficient $\alpha$ can be chosen among attack or release coefficients derived from different attack/release time constants, depending on whether the energy at the current frame is respectively larger or smaller than the smooth value at the previous frame.

The quantile generator produces quantile curves corresponding to each spectral profile. For example, in each band f, the x-th quantile $q_x(f)$ of the level distribution is computed as the value below which x % of the levels across frames in the band are contained. If the signal is multichannel, the level in each band at a given frame n can be computed, e.g., as the root-mean-square (RMS) average of energies across channels:

$$E(n)=\sqrt{(E^2(n,ch_1)+...+E^2(n,ch_N))}. \quad [3]$$

Other choices, such as taking the maximum across channels, lead to similar results in generic cases, but may be preferable in specific domains (e.g., applying to a 5.1 track).

FIG. 2 illustrates clustering of feature vectors, F(i), according to an embodiment. In the example shown, a k-means clustering algorithm is applied to feature vectors, F(i), where k=5. The output of the k-means clustering algorithm are 5 clusters 201-205 of different size. Each of clusters 201-205 has a centroid 201-1, 202-1, 203-1, 204-1 and 205-1, respectively, which is indicated by a solid triangle. In this example, the average energy per band E(f, i), the dynamic range per band DR(f, i) and the spectral slope SS(f, i) form the components of the feature vector, F(i). The k-means clustering algorithm generates k initial means (centroids), generates k clusters by assigning each feature vector, F(i), to a cluster with the nearest mean (centroid) based on a distance calculation (e.g., Euclidean distance), and updating or recalculating the means (centroid) based on the feature vectors assigned to the cluster. The assigning and updating of feature vectors to clusters repeats until convergence has been reached (e.g., the assignments no longer change).

Although k-means clustering is described in the example above, any suitable clustering algorithm may be used including but not limited to: k-medoids, Fuzzy C-Means, Gaussian mixture models trained with expectation-maximization, k-means++, Hartigan-Wong method of k-means, K-SVD, principal component analysis (PCA). Any suitable method can be used to generate the initial means (centroids), including but not limited to: Random Partition, Forgy, Maximin, Bradley and Fayyad's approach.

In addition to audio characteristics, semantic label features can also be clustered, including but not limited to: labels generated by audio content classifiers, or retrieved from metadata, or provided by a human listener through, e.g., a user interface. Some examples of semantic label features include but are not limited to information on the genre of a song (e.g., Rock, Jazz, etc.), a list of instruments present in the song (e.g. vocals, drums, guitar, etc.), information about the period in which each song was recorded (e.g. '70s, '80s, etc.). These semantic label features provide meaningful semantic information about the reference audio content, which can help system 400 make suitable choices of target profiles during automated selection of target profiles for DEQ, as described in reference to FIG. 4. For example, if a song has a prominent low-frequency peak and the song is identified as Hip-hop genre, the song is more likely to fit the aesthetics of the Hip-hop genre compared to a classical music piece with the same prominent peak, which is instead likely undesirable and thus important to correct.

In an embodiment, the semantic label features alone are used in clustering. For example, each song in the reference audio content is labeled by genre, and the songs sharing the same labels are clustered together. A song can be used in two different clusters if the song is associated with more than one label (e.g., Pop and Rock). Additionally, the instrument label is used to further subdivide each cluster into additional clusters, e.g., subdivide a jazz cluster into a cluster that includes jazz songs with vocals and a cluster that includes jazz songs without vocals.

The process of "clustering" based on semantic labels described above includes grouping of content that shares the same genre label. For example, all songs with the label "rock" are averaged to compute a target profile called "rock". Then if an input song has the label "rock", the "rock" target profile is chosen as the target profile for DEQ. The semantic label does not have to be provided by the user or embedded in the metadata; it is sufficient to run a tagger (e.g., an audio genre classifier) on the input audio before processing using the same tagging process used to tag the reference content.

The number of clusters k can be specified manually or obtained automatically. In an embodiment, k is determined by counter 107 counting how many unique genre labels are present in the reference audio content database. For example, if among a collection of ten songs the classifier assigns the labels "jazz," "classical" and "rock," then k is set to three, with the intention that a reasonable choice of features will lead the clustering algorithm to group songs pertaining to the same genre into the same cluster. The unique genre labels can be obtained from at least one an audio content classifier, metadata of the reference audio content items, or from a human listener.

Figure 3:
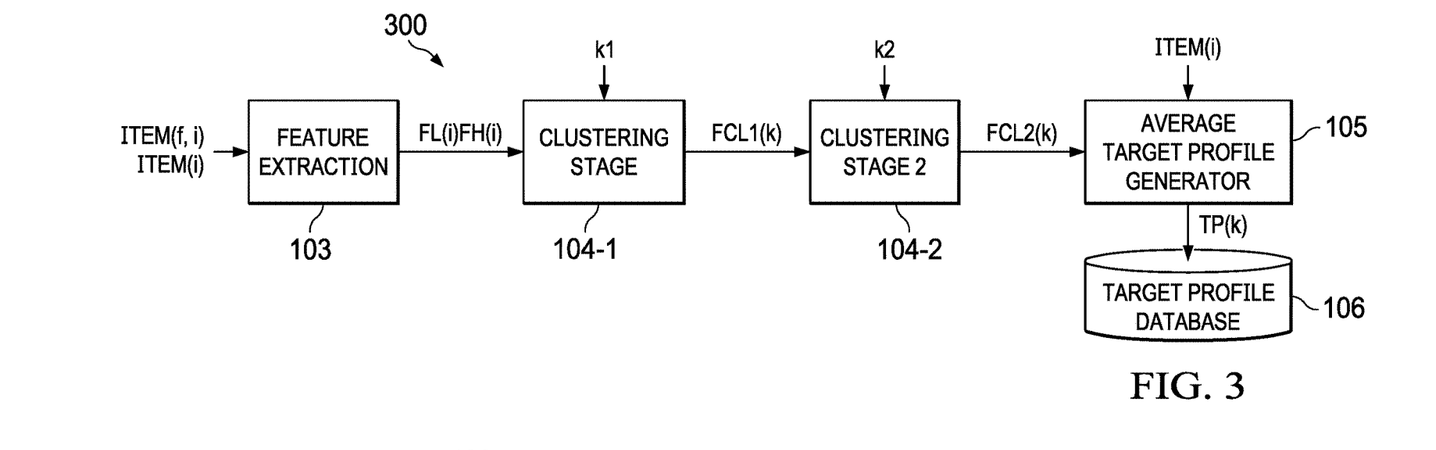
FIG. 3 is a block diagram of a system for automatic generation of target profiles using multiple clustering stages, according to an embodiment.

FIG. 3 is a block diagram of a system for automatic generation of target profiles using multiple clustering stages, according to an embodiment. In an embodiment, a first clustering stage 104-1 is performed based on a first type of features output by feature extraction unit 103 (e.g., audio characteristic features (FL(i)), or semantic features (FH(i)), also referred to low-level features and high-level features, respectively. Within each resulting cluster, FCL1(k), a second clustering stage 104-2 is performed based on a second type of features (e.g., semantic label features or audio characteristic features). The output of the second clustering stage, FCL2(k), is input into average target profile generator 105 which generates average target profiles and stores the target profiles in target profile database 106. The two clustering stages 104-1, 104-2 are applied sequentially. This allows one type of feature to dominate in the first clustering stage 104-1, and then perform sub-clustering on the first clusters output by clustering stage 104-1. For example, take all rock songs (semantic label features dominate), then create k clusters using clustering stage 104-2 within the previously clustered rock songs (audio characteristic features dominate).

In another embodiment, clustering is performed on audio characteristic features and semantic label features together, where the semantic label features are added to an audio characteristic feature vector to create an extended feature vector, and a distance between semantic label features is defined (e.g., distance=0 if label is the same, distance=c if the label is different). These extended feature vectors are then fed to the clustering algorithm. The value of c determines the "purity" of each cluster. For example, for a very small "c," clustering will ignore the labels (i.e., audio characteristic feature-only clustering), while for a very large "c" clustering will group by genres and ignore the audio characteristic features.

In another embodiment, clustering is performed based on audio characteristic features (e.g., E(f, i), DR(f, i) SS(f, i)), and then an overall set of semantic labels (e.g., Rock, Jazz, Hip-hop) are assigned to the cluster based on majority voting across the individual songs in the cluster. For example, if clustering returns a cluster of 10 songs, where 7 are labeled "Rock" and 3 are labeled "Jazz," the label "Rock" is assigned to the cluster. The underlying assumption of the above embodiment is that a label may be needed in the cluster, but the audio characteristics are more trustworthy when creating the clusters.

Automatic Selection of Target Profiles

Figure 4:
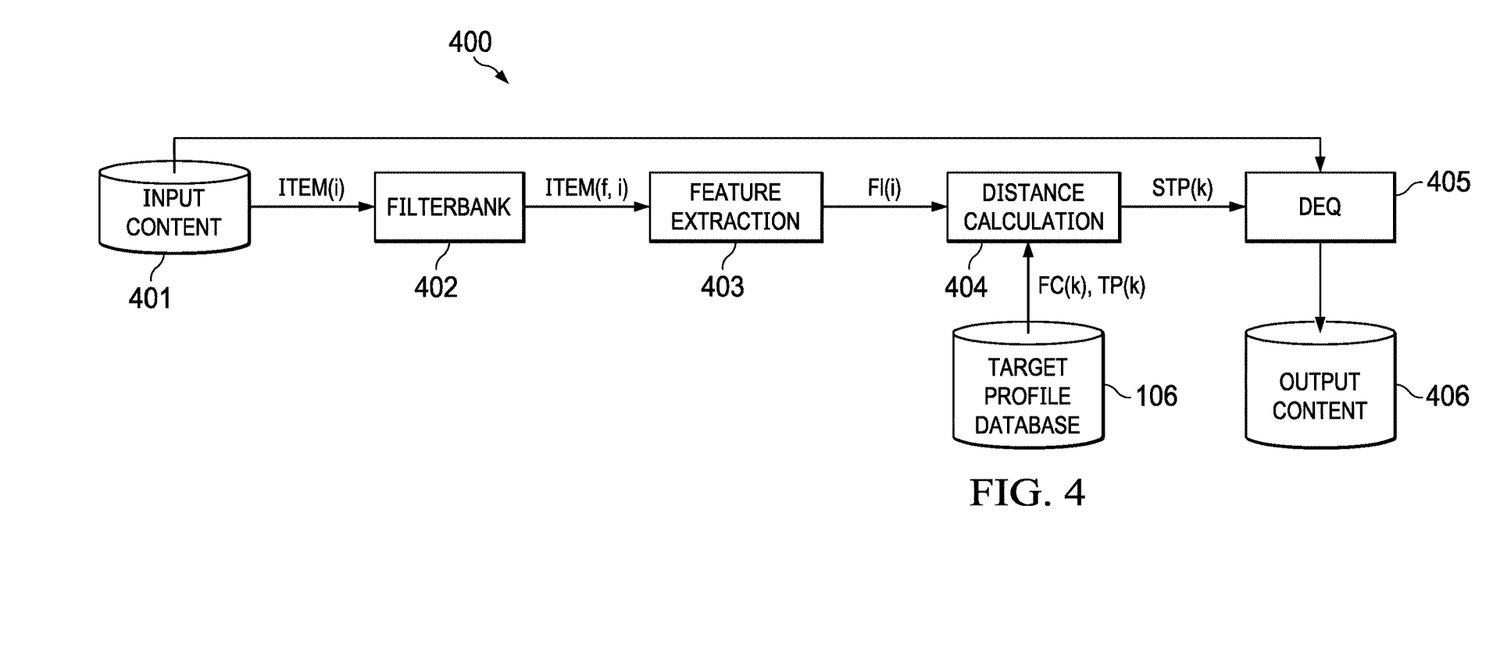
FIG. 4 is block diagram of a system for automatic selection of target profiles for DEQ of audio content, according to an embodiment.

FIG. 4 is block diagram of a system 400 for automatic selection of target profiles for DEQ, according to an embodiment. Once the plurality of automatically generated target profiles is available, our basic embodiment for automatic selection is implemented as follows.

Input content 401 (e.g., an audio file) is processed by filterbank 402 and feature extraction unit 403 to obtain feature vector FI(i) for input audio content items. In the feature space, a distance metric d(k) (e.g., Euclidean distance) is computed between the feature vector FI and the feature vectors FC(k) stored with corresponding target profiles TP(k) in database 106, as described in reference to FIG. 1.

A selected target profile STP(k) corresponding to a minimum distance d(k) is selected as the target profile for DEQ. This is equivalent to choosing the target profile with the highest similarity to the input profile. In an embodiment, if the minimum distance d(k) is larger than a threshold D, the selection is rejected, and the input audio content is processed using a default target profile; such default target profile can be obtained by averaging at least one of the plurality of target profiles or a plurality of the reference audio content items, as a compromise for out-of-distribution input audio content (i.e., audio content that is not represented in the reference audio content); alternatively, it can be a target profile for another cluster.

The target profile generation and selection techniques described above are useful whenever the characteristics of the input audio content are close to the audio characteristics of the target profile, hence only minor adjustments of EQ and dynamic range are necessary. The techniques, however, have limitations when applied to input audio content that requires large EQ adjustments.

Consider, for example, a recording of hip-hop music, where due to some imperfection in the recording process, the low frequencies are too weak and the high frequencies are too prominent. Imagine also that two target profiles are available that were obtained from a good recording of hip-hop music and acoustic music respectively. The techniques described above, which are based on similarity between the input audio content and target profiles, will assign the "acoustic" target profile to the input audio content, thus preventing DEQ from restoring the desired spectral balance of the input audio content. In this example, tagging the input audio content and the target profiles as "hip-hop" or "acoustic" would result in a more appropriate selection of the target profile for DEQ. Therefore, in an embodiment, only the labels/tags are used to assign the input content to the target cluster. These labels/tags can be any combination of the semantic labels/tags, such as the genre, the tonality, the instruments, etc. In other embodiments, the target profile is selected by combining the audio characteristic cluster selection with the semantic label cluster selection. If different audio characteristics clusters and semantic clusters exist, the input audio content is processed with a target profile representing an average or a weighted combination of the audio characteristic target profile and the semantic target profile.

In an embodiment, a partial subset of features is used to compute the distance between an input audio content and target clusters, where the partial subset of features can include a combination of low-level features and high-level features. The latter embodiment, where a distinct set of features is used for the target profile generation and selection stages, is motivated by maximizing two different goals for each stage. For example, in the generating stage, it is desirable to exploit as much information as possible to ensure that the clusters are maximally diverse among themselves, and that similar content is assigned to the same cluster. On the other hand, in the selection stage it may be desirable to privilege certain features which are deemed more relevant to the application at hand (e.g., more relevant to speech only applications versus music).

In an embodiment, a portion of the input audio content (e.g., the first 30 seconds) as opposed to the entire input audio content is used to compute a feature vector for efficiency reasons.

Example Processes

Figure 5:
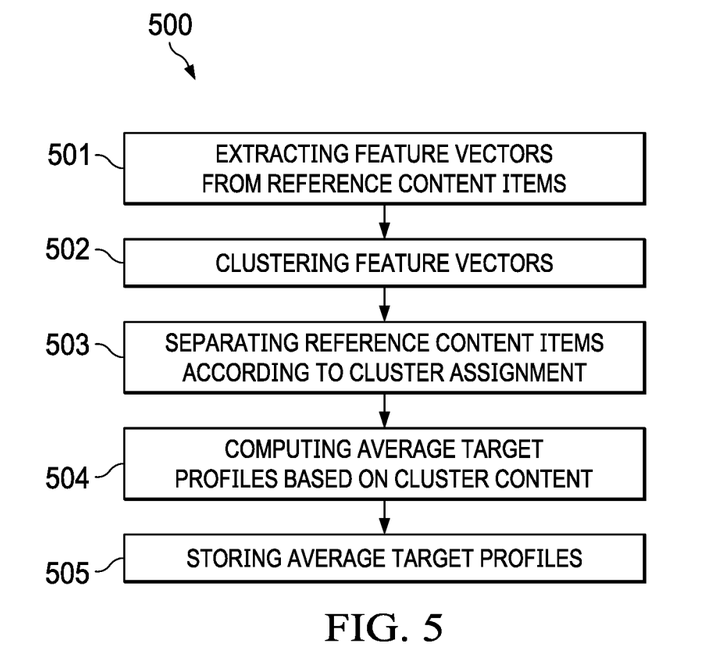
FIG. 5 is a flow diagram of a process automatic generation of target profiles for DEQ of audio content, according to an embodiment.

FIG. 5 is a flow diagram of a process 500 automatic generation of target profiles for DEQ, according to an embodiment. Process 500 can be implemented using, for example, device architecture 700 described in reference to FIG. 7.

Figure 6:
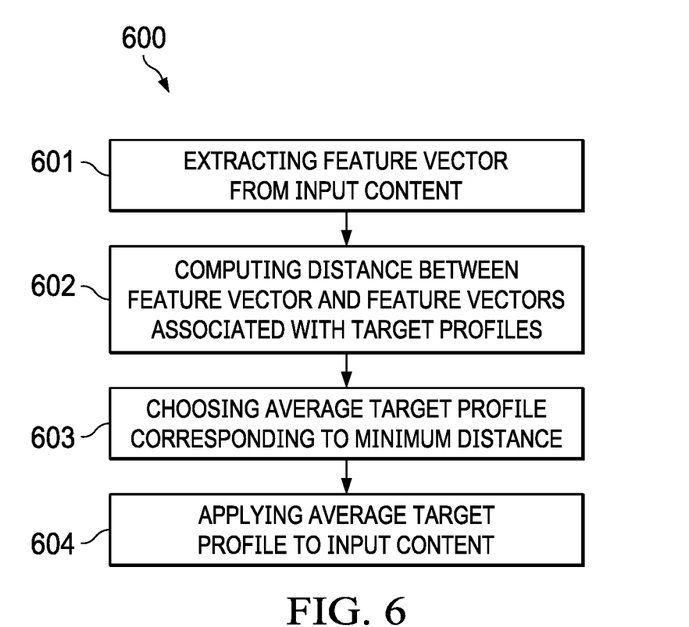
FIG. 6 is a flow diagram of a process automatic selection of target profiles for DEQ of audio content, according to an embodiment.

Process 500 includes the steps of extracting feature vectors from reference audio content items (501), clustering the feature vectors (502), separating reference content items according to cluster assignment (503), computing average target profiles for each cluster based on the reference audio content assigned to the cluster (504) and storing the average target profiles for use in automated selection of target profiles for an input audio content, as described in reference to FIG. 6.

FIG. 6 is a flow diagram of a process 600 automatic selection of target profiles for DEQ, according to an embodiment. Process 600 can be implemented using, for example, device architecture 700, as described in reference to FIG. 7.

Process 600 includes the steps of extracting feature vectors from input audio content (601), computing a distance between the feature vectors and cluster feature vectors associated with target profiles (602), choosing an average target profile corresponding to a minimum distance (603) and applying the average target profile to the input audio content during DEQ.

Example System Architecture

Figure 7:
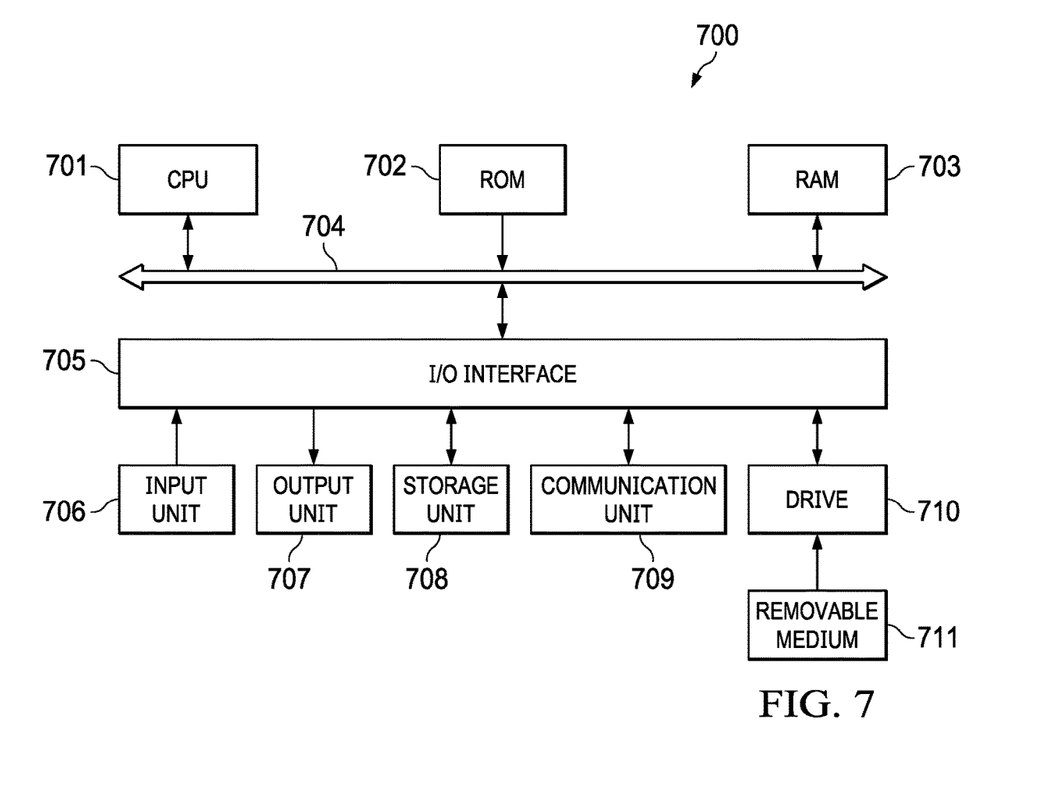
FIG. 7 is a block diagram of an example device architecture for implementing the features and processes described in reference to FIGS. 1-6, according to an embodiment.

FIG. 7 shows a block diagram of an example system 700 suitable for implementing example embodiments described in reference to FIGS. 1-6. System 700 includes a central processing unit (CPU) 701 which is capable of performing various processes in accordance with a program stored in, for example, a read only memory (ROM) 702 or a program loaded from, for example, a storage unit 708 to a random access memory (RAM) 703. In the RAM 703, the data required when the CPU 701 performs the various processes is also stored, as required. The CPU 701, the ROM 702 and the RAM 703 are connected to one another via a bus 704. An input/output (I/O) interface 705 is also connected to the bus 704.

The following components are connected to the I/O interface 705: an input unit 706, that may include a keyboard, a mouse, or the like; an output unit 707 that may include a display such as a liquid crystal display (LCD) and one or more speakers; the storage unit 708 including a hard disk, or another suitable storage device; and a communication unit 709 including a network interface card such as a network card (e.g., wired or wireless).

In some embodiments, the input unit 706 includes one or more microphones in different positions (depending on the host device) enabling capture of audio signals in various formats (e.g., mono, stereo, spatial, immersive, and other suitable formats).

In some embodiments, the output unit 707 include systems with various number of speakers. The output unit 707 can render audio signals in various formats (e.g., mono, stereo, immersive, binaural, and other suitable formats).

The communication unit 709 is configured to communicate with other devices (e.g., via a network). A drive 710 is also connected to the I/O interface 705, as required. A removable medium 711, such as a magnetic disk, an optical disk, a magneto-optical disk, a flash drive or another suitable removable medium is mounted on the drive 710, so that a computer program read therefrom is installed into the storage unit 708, as required. A person skilled in the art would understand that although the system 700 is described as including the above-described components, in real applications, it is possible to add, remove, and/or replace some of these components and all these modifications or alteration all fall within the scope of the present disclosure.

In accordance with example embodiments of the present disclosure, the processes described above may be implemented as computer software programs or on a computer-readable storage medium. For example, embodiments of the present disclosure include a computer program product including a computer program tangibly embodied on a machine readable medium, the computer program including program code for performing methods. In such embodiments, the computer program may be downloaded and mounted from the network via the communication unit 709, and/or installed from the removable medium 711, as shown in FIG. 7.

Generally, various example embodiments of the present disclosure may be implemented in hardware or special purpose circuits (e.g., control circuitry), software, logic or any combination thereof. For example, the units discussed above can be executed by control circuitry (e.g., a CPU in combination with other components of FIG. 7), thus, the control circuitry may be performing the actions described in this disclosure. Some aspects may be implemented in hardware, while other aspects may be implemented in firmware or software which may be executed by a controller, microprocessor or other computing device (e.g., control circuitry). While various aspects of the example embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

Additionally, various blocks shown in the flowcharts may be viewed as method steps, and/or as operations that result from operation of computer program code, and/or as a plurality of coupled logic circuit elements constructed to carry out the associated function(s). For example, embodiments of the present disclosure include a computer program product including a computer program tangibly embodied on a machine readable medium, the computer program containing program codes configured to carry out the methods as described above.

In the context of the disclosure, a machine readable medium may be any tangible medium that may contain, or store a program for use by or in connection with an instruction execution system, apparatus, or device. The machine readable medium may be a machine readable signal medium or a machine readable storage medium. A machine readable medium may be non-transitory and may include but not limited to an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Computer program code for carrying out methods of the present disclosure may be written in any combination of one or more programming languages. These computer program codes may be provided to a processor of a general purpose computer, special purpose computer, or other programmable data processing apparatus that has control circuitry, such that the program codes, when executed by the processor of the computer or other programmable data processing apparatus, cause the functions/operations specified in the flowcharts and/or block diagrams to be implemented. The program code may execute entirely on a computer, partly on the computer, as a stand-alone software package, partly on the computer and partly on a remote computer or entirely on the remote computer or server or distributed over one or more remote computers and/or servers.

While this document contains many specific embodiment details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination. Logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A method of automatically generating target profiles for dynamic equalization of audio content, the method comprising:

obtaining, with at least one processor, reference audio content items;

filtering, with the at least one processor, the reference audio content items to separate the reference audio content items into different frequency bands of a frequency spectrum of the reference audio content items;

for each frequency band,
extracting, with the at least one processor, a first feature vector from at least a portion of each of the reference audio content items, wherein the first feature vector includes at least one audio characteristic of the reference audio content items;

obtaining, with the at least one processor, at least one semantic label describing the reference audio content items from at least a portion of each of the reference audio content items;

obtaining, with the at least one processor, a second feature vector consisting of the first feature vectors per frequency band and the at least one semantic label;

generating, with the at least one processor and based on the second feature vector, cluster feature vectors representing centroids of clusters, where each reference audio content item is assigned to at least one cluster;

separating, with the at least one processor, the reference audio content items according to the cluster feature vectors;

computing, with the at least one processor, an average target profile for each cluster based on the reference audio content items in the cluster; and storing, with the at least one processor, the average target profile and corresponding cluster feature vector for each cluster in a storage device.

2. The method of claim 1, wherein generating cluster feature vectors representing centroids of clusters includes generating cluster feature vectors using only the at least one audio characteristics of the first feature vector.

3. The method of claim 1, wherein generating cluster feature vectors representing centroids of clusters includes generating cluster feature vectors using only the at least one semantic label of the second feature vector.

4. The method of claim 1, wherein the at least one audio characteristic is average energy.

5. The method of claim 1, where the at least one audio characteristic is dynamic range based on a difference between two percentiles in an energy distribution of the reference audio content item.

6. The method of claim 1, wherein the at least one audio characteristic is spectral slope comprising a line that fits an average energy between two frequency bands.

7. The method of claim 1, wherein the at least one audio characteristic is spectral flux, crest factor.

8. The method of claim 1, wherein the at least one audio characteristic is a zero crossing rate.

9. The method of claim 1, wherein cluster feature vectors are generated using k-means clustering.

10. The method of claim 1, further comprising:
obtaining, with the at least one processor, a number of unique genre labels represented in the reference audio content; and
setting a minimum number of clusters equal to the number of genres represented in the reference audio content.

11. The method of claim 10, wherein the number of unique genre labels are obtained from at least one of an audio content classifier, metadata of the reference audio content items, or from a human listener.

12. The method of claim 1, wherein the semantic label is obtained from at least one of an audio content classifier, metadata of the reference audio content item, or from a human listener.

13. A method of automatically generating target profiles for dynamic equalization of audio content, the method comprising:
obtaining, with at least one processor, a first set of reference audio content items;
filtering, with the at least one processor, the first set of reference audio content items to separate the first set of reference audio content items into different frequency bands of a frequency spectrum of the reference audio content items;
extracting, with the at least one processor, a semantic label feature vector from at least a portion of each of the first set of reference audio content items, wherein the semantic label feature vector includes a semantic label describing the reference audio content item;
generating, with the at least one processor and based on the semantic label feature vectors, a first set of cluster feature vectors representing a first set of centroids of a first set of clusters;
separating, with the at least one processor, the first set of reference audio content items into a first set of clusters according to the first set of cluster feature vectors;
for each cluster in the first set of clusters:
for each frequency band:
extracting, with the at least one processor, an audio characteristic feature vector from the reference audio content items assigned to the cluster, wherein the audio characteristic feature vector includes an audio characteristic of the first set of reference audio content items;
generating, with the at least one processor and based on the audio characteristic feature vector, a second set of cluster feature vectors representing a second set of centroids of a second set of clusters;
separating, with the at least one processor, the reference audio content items into a second set of clusters according to the second set of cluster feature vectors;
computing, with the at least one processor, an average target profile for each cluster in the second set of clusters based on the reference audio content items in the cluster; and
storing, with the at least one processor, the average target profile and the corresponding second set of cluster feature vectors in a storage device.

14. A method of automatically generating target profiles for dynamic equalization of audio content, the method comprising:
obtaining, with at least one processor, reference audio content items;
filtering, with the at least one processor, the reference audio content items to separate the reference audio content items into different frequency bands of a frequency spectrum of the reference audio content items;
for each frequency band,
extracting, with the at least one processor, an audio characteristic feature vector from at least a portion of each of the reference audio content items, wherein the audio characteristic feature vector includes an audio characteristic of the reference audio content items;
generating, with the at least one processor and based on the audio characteristic feature vector, cluster feature vectors representing centroids of clusters, where each reference audio content item is assigned to at least one cluster;
separating, with the at least one processor, the reference audio content items according to the cluster feature vectors;
assigning to each cluster feature vector a semantic label based on semantic labels associated with individual reference audio content items in the cluster;
computing, with the at least one processor, an average target profile for each cluster based on the semantic label assigned to the cluster; and
storing, with the at least one processor, the average target profile and corresponding cluster feature vector for each cluster in a storage device.

15. A method of automatically selecting target profiles for dynamic equalization of audio content, the method comprising:
obtaining, with at least one processor, an input audio content item;
filtering, with the at least one processor, the input audio content item to separate the input audio content item into different frequency bands of a frequency spectrum of the input audio content item;
for each frequency band,
extracting, with the at least one processor, a first feature vector from at least a portion of the input audio content item, wherein the first feature vector includes at least one audio characteristic of the input audio content item
obtaining at least one semantic label describing the input audio content item from at least a portion of the input audio content item;
obtaining, with the at least one processor, a second feature vector consisting of the first feature vectors per frequency band and the at least one semantic label;
computing, with the at least one processor, a distance metric between the second feature vector and a plurality of cluster feature vectors corresponding to a plurality of target profiles, wherein the plurality of cluster feature vectors each are associated with a cluster of reference audio content items, and include at least one audio characteristic of the reference audio content items and at least one semantic label describing the reference audio content items;
selecting, with the at least one processor, a particular target profile from the plurality of target profiles corresponding to a minimum distance metric among the computed distance metrics; and
applying, with the at least one processor, dynamic equalization to the input audio content item using the particular target profile.

16. The method of claim 15, wherein the distance metric is a Euclidian distance metric.

17. The method of claim 15, further comprising:
determining, with the at least one processor, that the minimum distance is larger than a threshold;
rejecting the selected target profile;
selecting, with the at least one processor, a default target profile; and
applying, with the at least one processor, dynamic equalization on the input audio content item using the default target profile.

18. The method of claim 15, wherein the default target profile is an average target profile computed by averaging at least one of the plurality of target profiles or plurality of the reference audio content items, or is a target profile for another cluster.

19. A system of processing audio, comprising:
one or more processors; and
a non-transitory computer-readable medium storing instructions that, when executed by the one or more processors, cause the one or more processors to perform operations of claim 1.

20. A non-transitory computer-readable medium storing instructions that, when executed by the one or more processors, cause the one or more processors to perform operations of claim 1.

* * * * *